US006828201B1

(12) United States Patent
Ramkumar

(10) Patent No.: US 6,828,201 B1
(45) Date of Patent: Dec. 7, 2004

(54) METHOD OF MANUFACTURING A TOP INSULATING LAYER FOR A SONOS-TYPE DEVICE

(75) Inventor: Krishnaswamy Ramkumar, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/054,515

(22) Filed: Oct. 22, 2001

(51) Int. Cl.⁷ .......................................... H01L 21/8236
(52) U.S. Cl. ..................................... 438/288; 438/585
(58) Field of Search ............................ 438/288, 585, 438/591

(56) References Cited

U.S. PATENT DOCUMENTS

| 6,037,273 A | 3/2000 | Gronet et al. |
| 6,410,456 B1 | 6/2002 | Gronet et al. |

Primary Examiner—Evan Pert
Assistant Examiner—Lisa Kilday
(74) Attorney, Agent, or Firm—Bradley T. Sako

(57) ABSTRACT

A method of forming a top oxide layer of a SONOS-type nonvolatile storage device is disclosed. According to a first embodiment, a method may include forming an in situ steam generation (ISSG) top oxide layer 208 from a charge storing dielectric layer 206 by reacting hydrogen and oxygen on a wafer surface (step 102) and depositing a conductive gate layer 210 (step 104). An ISSG top oxide layer 208 may be of higher quality and formed with a smaller thermal budget than conventional approaches.

20 Claims, 6 Drawing Sheets

METHOD OF MANUFACTURING A TOP INSULATING LAYER FOR A SONOS-TYPE DEVICE

TECHNICAL FIELD

The present invention relates generally to dielectrics for field effect semiconductor devices, and more particularly to dielectrics for SONOS-type nonvolatile semiconductor devices.

BACKGROUND OF THE INVENTION

As is well known, semiconductor devices can include an insulated gate field effect transistor (IGFET) type device. IGFET-type devices typically include a transistor gate separated from a channel region by a dielectric. A potential applied to a gate can then be varied to alter channel conductivity.

While many IGFET type devices are volatile (e.g., conventional metal-oxide-semiconductor FETs), nonvolatile devices may also include IGFET-like approaches. One conventional nonvolatile device can be a floating gate electrically erasable programmable read only memory (EEPROM). A floating gate EEPROM can include a floating gate electrode situated between a control gate and a channel. Charge, including electrons and/or "holes" may be stored in a floating gate electrode. Such a charge may alter a threshold voltage of a resulting nonvolatile IGFET-type device. As will be noted below, a drawback to any floating gate device can be higher programming and/or erase voltages with respect to other nonvolatile approaches.

Another nonvolatile IGFET type device can include a dielectric interface to store (i.e., trap) charge. For example, devices have been proposed that include a metal gate formed over a dielectric of silicon nitride and silicon dioxide. Such devices have been referred to as metal-nitride-oxide-semiconductor (MNOS) devices. A drawback to many MNOS devices has been lack of charge retention and/or uniformity of programming.

A third type of nonvolatile device may include one or more dielectric layers for storing charge. Such devices may be referred to generally as silicon-oxide-nitride-oxide-silicon (SONOS) type devices. One very basic type of SONOS device may include a polycrystalline silicon ("polysilicon") gate formed over a dielectric layer that includes a silicon nitride layer sandwiched between silicon dioxide layers.

SONOS devices can have lower programming voltages than other conventional nonvolatile devices, such as some types of floating gate devices. In addition, the SONOS fabrication process can be compatible with standard complementary metal oxide semiconductor (CMOS) process technology. To maintain this compatibility, SONOS devices may be scaled along with other transistors used in the process. The ability of SONOS devices to maintain performance and reliability as they are scaled can be an important feature.

To better understand the formation of SONOS devices, a conventional way of forming a SONOS device is set forth in FIGS. 6 and 7. FIG. 6 is a flowchart illustrating several process steps involved in creating an integrated circuit containing SONOS devices. FIGS. 7A–7H set forth a number of side cross-sectional views of a portion of an integrated circuit containing SONOS devices following the various process steps described in FIG. 6.

The conventional process described in FIG. 6 is designated by the general reference character 600. A conventional process 600 may include the steps of growing a tunnel oxide 602, depositing a silicon nitride layer 604, depositing a top oxide layer 606, depositing a polysilicon gate layer 608, forming a gate mask 610, etching gates 612, and depositing and etching a spacer layer 614.

Referring to FIG. 7A, a side cross-sectional view of a portion of an integrated circuit prior to the beginning of a conventional process 600 is shown. The integrated circuit portion includes a substrate 700, and may include isolation regions 702 formed by prior process steps. As an example, isolation regions 702 may be formed by various conventional isolation processes including but not limited to shallow trench isolation (STI) or the local oxidation of silicon (LOCOS).

It is noted that a substrate 700 may also include various impurity regions, form by ion implantation and/or diffusion methods. As but a few examples, n-type wells may be formed in a p-type substrate (or vice versa), or p-type wells may be formed within n-type wells (or vice versa). An important aspect of forming diffusion regions can be controlling the depth and/or lateral extents of such regions. Subjecting diffusion regions to temperature cycles following their initial formation can result in the dopants of the diffusion region diffusing deeper and/or further than desired, increasing the extents of the junction, and/or lowering the "abruptness" of a dopant concentration at the edge of a p-n junction. Too many temperature cycles may thus result in adverse transistor operation due to junction breakdown or "punchthrough" current, to name just two examples. Consequently, the fabrication process of an integrated circuit may emphasize minimizing a device's exposure to temperature cycles (keeping as small a "thermal budget" as possible).

Referring again to FIG. 6, a conventional process 600 may begin by growing a tunnel oxide (step 602). A portion of an integrated circuit following step 602 is set forth in FIG. 7B. Referring to FIG. 7B, a portion of an integrated circuit includes a tunnel oxide 704 on a substrate 700. A tunnel oxide 704 is generally very thin and may be on the order of 15 angstroms (15 Å) thick.

A conventional process 600 can continue by depositing a silicon nitride layer (step 604). A portion of an integrated circuit following step 604 is set forth in FIG. 7C. Referring to FIG. 7C, an integrated circuit portion now includes a nitride layer 706 deposited over a tunnel oxide 704. A nitride layer 706 generally consists of silicon nitride ($Si_3N_4$), and may be 80–100 Å thick.

A conventional process 600 can continue by depositing a top oxide layer (step 606). Referring to FIG. 7D, an example of a portion of an integrated circuit following step 606 is set forth. A substrate 700 now includes a tunnel oxide 704, a nitride layer 706 and a top oxide layer 708. A top oxide layer 708 can be conventionally formed by chemical vapor deposition (CVD) and may generally be 30–40 Å thick.

A conventional process 600 can continue by depositing a polysilicon gate layer (step 608). An example of a portion of an integrated circuit following step 608 is set forth in FIG. 7E. Referring to FIG. 7E, a polysilicon gate layer 710 has been deposited on a top oxide layer 708. As also shown in FIG. 7E, a gate protection insulator may also be formed over polysilicon gate layer 710.

At this point, in the conventional process 600, five layers of a SONOS device have been created. The silicon-oxide-nitride-oxide-silicon layers correspond to the substrate 700, tunnel oxide layer 704, nitride layer 706, top oxide layer 708, and polysilicon gate layer 710, respectively.

The conventional process 600 may continue with lithography and etch steps to isolate and form SONOS devices. A gate mask may first be formed (step 610). An example of a portion of an integrated circuit following step 610 is set forth in FIG. 7F. A gate mask material 712 has been deposited and patterned using any of various lithographic techniques. The gate mask material 712 may generally consist of a photoresist material.

Following the formation of a gate mask (step 610), gates can be etched (step 612). Referring to FIG. 7G, a portion of an integrated circuit following step 612 is set forth. A suitable etch process has been applied to remove portions of the tunnel oxide 704, nitride layer 706, top oxide layer 708, and polysilicon gate layer 710 that are not covered by gate mask material 712. In this manner, SONOS devices are formed and isolated on the substrate 700.

The conventional process 600 can continue by depositing and etching a spacer layer (step 614). An example of a portion of an integrated circuit following step 614 is set forth in FIG. 7H. Referring to FIG. 7H, a spacer layer 714 has been formed that surrounds and isolates the SONOS gates. The spacer layer 714 may consist of silicon dioxide. Note that in FIG. 7H, the gate mask layer 712 has been removed by suitable process means.

While the conventional process described may produce an integrated circuit containing SONOS devices of reasonable quality and performance, certain aspects of the process are critical in maintaining device performance and reliability as the SONOS devices are scaled to realize lower programming voltages and to maintain compatibility with CMOS process technology.

A top oxide layer 708 may suffer from certain drawbacks as a SONOS device is scaled down. A top oxide layer 708 can function to isolate the transfer of charge between a nitride storage layer 706 and a polysilicon gate layer 710, permitting scaling of a nitride layer 706 to realize low programming voltages. Consequently, the lower the quality of a top oxide layer 708, the more charge that may leak through such a layer. For this reason, quality of top oxide layer 708 can be an important feature in a SONOS-type device.

An oxide layer, such as a SONOS-type device top oxide layer, can generally be formed by either thermal oxidation or by chemical vapor deposition (CVD). Thermal oxides, which can be grown from a base material of silicon nitride and/or silicon oxynitride, can be higher quality oxides as they can be denser and/or less porous and/or more reliably formed. Thus, thermal oxides can be better insulators. A drawback to thermal oxides can be the typically large thermal budget required to form them.

For a conventional SONOS process, the thermal budget required for a thermally grown top oxide layer may be about 1000° C. to 1100° C. for 3 to 4 hours, because the oxidation rate of silicon nitride and/or silicon oxynitride can be considerably slower than the oxidation of other materials, such as silicon. This large thermal budget may result in an unacceptable diffusion of channel and well implant dopants.

While conventional oxidation may provide higher quality oxide layers, such processes may result in an overall thermal budget that is unacceptably high. Consequently, conventional approaches may form top oxide layers by a deposition process. Conventional deposition processes typically include a gaseous reaction that can result in a top oxide layer being formed over a nitride and/or oxynitride layer. Thus, unlike oxidation steps, deposition processes are not necessarily dependent upon the underlying material. Deposition process may also have considerably smaller thermal budgets. For example, a conventional oxide deposition process may occur at a temperature of about 750° C. for about 3–4 minutes. Deposited oxides are therefore typically used for the top oxide layer 708 in a conventional SONOS process.

Limitations of a deposited top oxide layer 708 may include poor quality because it is not as dense as a thermal oxide, and/or poor uniformity of thickness, and/or a rough interface between the nitride layer 706 and the top oxide layer 708. A rough interface may include a large number of interface traps. These limitations limit device performance and/or reliability, and/or the ability to scale SONOS devices for low programming voltages.

Various oxidation methods directed to other structures of a semiconductor device are known. In particular, surfaces of a shallow trench isolation (STI) trench are known to be oxidized by thermally reacting hydrogen ($H_2$) and oxygen ($O_2$) on a substrate surface (i.e., in situ steam generation). Such an oxidation may take place prior to filling the STI trench with an isolation material. Further, such a substrate may still contain a trench etch mask of nitride formed over a sacrificial oxide layer.

In light of the limitations of the conventional process set forth above, it would be desirable to form a top insulating layer for a SONOS device that has the high quality of a thermally grown oxide without the large thermal budget that is conventionally required.

SUMMARY OF THE INVENTION

According to one embodiment of the present invention, a method may include growing a thermal oxide by reacting hydrogen and oxygen on a wafer surface, and forming a conductive gate over the oxide.

According to one aspect of the embodiment, the conductive gate material may be polysilicon.

According to another embodiment, a method may include forming a tunnel dielectric, forming a charge storing dielectric layer, forming a top oxide layer, forming a gate layer, forming a gate etch mask, etching to form gate stacks, and forming insulating sidewalls.

According to one aspect of this embodiment, the charge storing dielectric layer may include silicon nitride.

According to another aspect of this embodiment, the method may be used to create a SONOS-type nonvolatile semiconductor storage device.

DETAILED DESCRIPTION OF THE EMBODIMENTS

Various embodiments of the present invention will now be discussed in conjunction with a number of figures. The embodiments set forth approaches to forming a thermal oxide on a charge storing dielectric layer. In particular embodiments, these layers may be used to form a SONOS-type nonvolatile semiconductor storage device.

Figure 1:
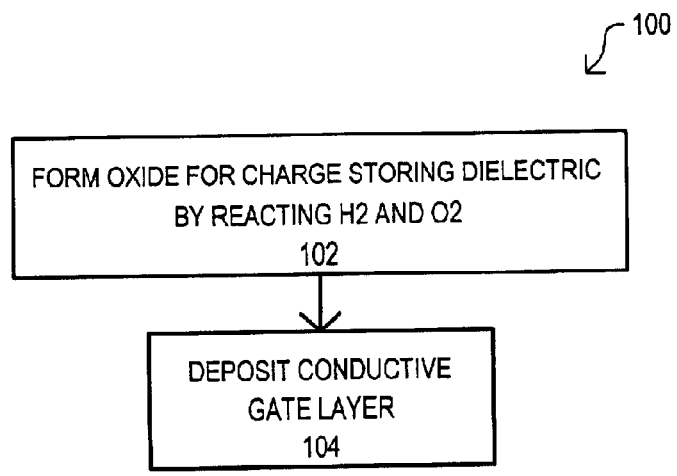
FIG. 1 is a block diagram showing a method of manufacturing a nonvolatile semiconductor device according to one embodiment.
Figure 2A:
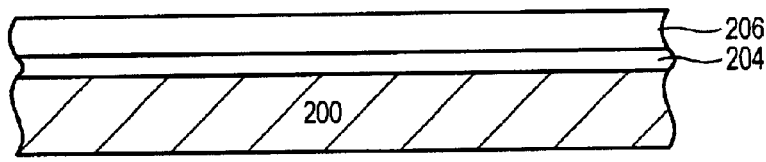
FIGS. 2A, 2B, and 2C are side cross-sectional views showing the method of FIG. 1.
Figure 2B:
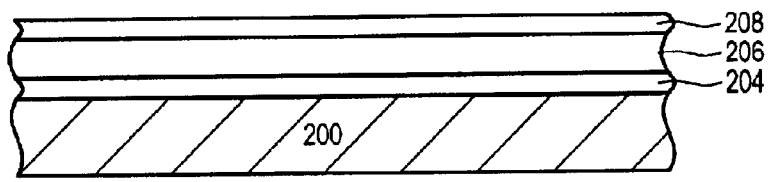
Figure 2C:
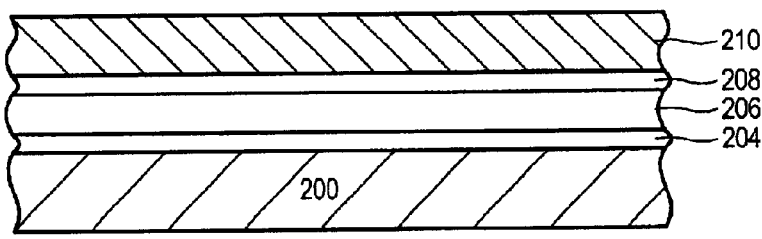

Referring now to FIG. 1, a method of forming a series of semiconductor device layers is set forth in a block diagram designated by the general reference character 100. The first embodiment 100 may include the steps of forming an oxide layer from a charge storing dielectric layer 102 and depositing a conductive gate layer 104. FIGS. 2A–2C set forth a number of cross-sectional views of a portion of a semiconductor device corresponding to the process steps described in FIG. 1.

Referring to FIG. 2A, a portion of a semiconductor device includes a tunneling dielectric 204 and a charge storing dielectric layer 206 on a semiconductor substrate 200. A tunneling dielectric may include silicon dioxide, and a charge storing dielectric may include silicon nitride, silicon oxynitride, and/or silicon-rich silicon nitride, as but a few examples. A tunneling dielectric may be formed by conventional means, such as oxidizing a silicon substrate. A charge storing dielectric may be formed by chemical vapor deposition methods.

A method according a first embodiment may include forming an oxide layer for a charge storing dielectric layer (step 102). Referring to FIG. 2B an oxide layer 208 has been formed over a charge storing dielectric layer 206.

In a preferred embodiment, an oxide layer 208 is thermally grown from a charge storing dielectric layer 206 by reacting hydrogen and oxygen on the wafer surface. This reaction may occur at temperatures in the range of 900° C. to 1100° C. In this approach, the oxide layer 208 may be formed in about one minute and may grow an oxide layer about 30–40 Angstroms thick. The formation of a thermal oxide in this manner may also be referred to as In Situ Steam Generation (ISSG).

In this way, a high quality thermal oxide may be grown in a shorter time than conventional oxidation approaches. As a result, such a step may provide for a lower thermal budget than conventional approaches that may grow an oxide layer according to other methods.

According to a first embodiment, a method may also include depositing a conductive gate layer (step 104). Referring to FIG. 2C, a semiconductor device portion is shown to include a gate layer 210 that has been formed over an oxide layer 208. A gate layer 210 may include polysilicon, as but one example.

In this way, a first embodiment may form a top oxide layer for charge storing dielectric that can have a higher quality than deposition approaches, but with a thermal budget that may be lower than conventional oxidation approaches.

A second embodiment of the present invention will now be described.

The second embodiment includes a method for forming an ISSG oxide layer on an integrated circuit that may include insulated gate field effect transistor (IGFET) type devices. One example of an IGFET type device can be a SONOS-type nonvolatile semiconductor storage device.

Figure 3:
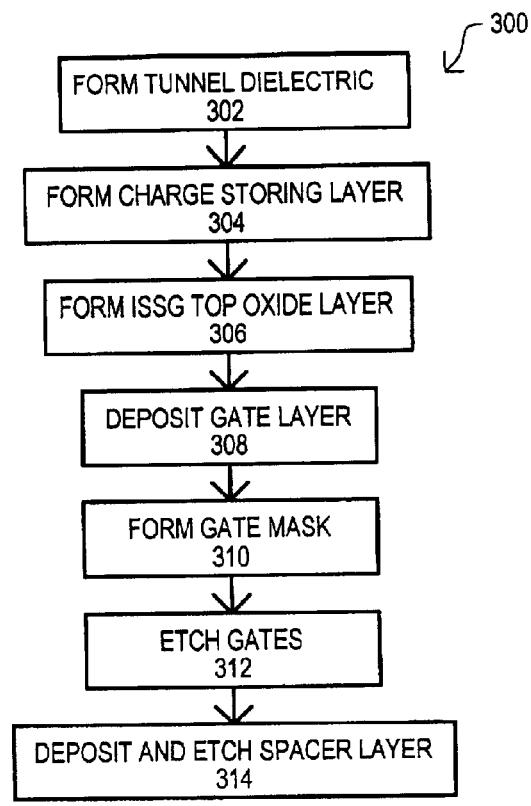
FIG. 3 is a block diagram showing a method of manufacturing a nonvolatile semiconductor device according to another embodiment.

A flow diagram is set forth in FIG. 3 that describes a second embodiment of the present invention. A second embodiment is designated by the general reference character 300, and may include the steps of growing a tunnel oxide 302, depositing a nitride layer 304, forming an ISSG top oxide layer 306, depositing a polysilicon gate layer 308, forming a gate mask 310, etching gates 312, and depositing and etching a spacer layer 314. FIGS. 4A–4H set forth a number of side cross-sectional views of a portion of an integrated circuit containing SONOS semiconductor devices following the various process steps described in FIG. 3.

Figure 4A:
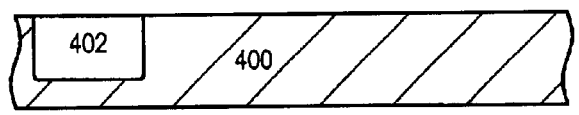
FIGS. 4A to 4H are side cross-sectional views showing the method of FIG. 3.

Referring to FIG. 4A, a side cross-sectional view of a portion of an integrated circuit prior to the start of the second embodiment process 300 is shown. The integrated circuit portion includes a substrate 400, and may include an isolation region 402 formed by prior conventional process steps. In addition, as noted in conjunction with the first embodiment, a substrate may include impurity regions, such as wells and/or channel regions.

Figure 4B:

The second embodiment 300 may begin by growing a tunnel oxide layer (step 302). A portion of an integrated circuit following step 302 is set forth in FIG. 4B. Referring to FIG. 4B, a portion of an integrated circuit includes a tunnel oxide 404 on a substrate 400. A tunnel oxide 404 can be generally very thin with respect to other device layers, and may be on the order of 15 Å thick. In one very particular arrangement, a tunnel oxide may be grown by placing a wafer into a rapid thermal oxidation (RTO) chamber. A dry oxidation process may form a tunnel oxide of thermally grown silicon dioxide.

Figure 4C:
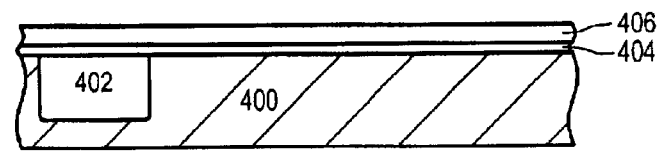

A second embodiment 300 can continue by depositing a nitride layer (step 304). A portion of an integrated circuit following step 304 is set forth in FIG. 4C. Referring now to FIG. 4C, an integrated circuit portion now includes a nitride layer 406 deposited over a tunnel oxide 404. A nitride layer 406 may include silicon nitride ($Si_3N_4$), silicon oxynitride, and/or silicon-rich nitride, in one or more layers. Silicon-rich nitride may include silicon nitride having greater than stoichiometric ratios of silicon to nitride. In one arrangement, a nitride layer 406 may be 80–100 Å, as but one example. In one very particular example, a nitride layer may be formed by transferring a wafer from an RTO chamber into a low pressure chemical vapor deposition chamber (LPCVD). Silicon nitride (or a similar such material) may then be formed with low pressure chemical vapor deposition techniques. Base materials of an LPCVD process may include ammonia ($NH_3$), dichlorosilane (DCS), and/or nitrous oxide ($N_2O$).

Figure 4D:
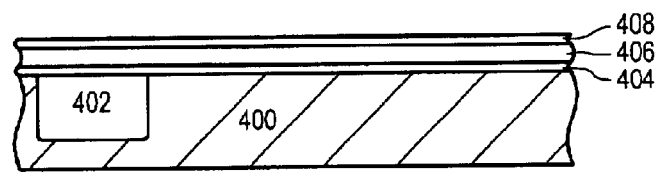

A second embodiment 300 can continue by forming an ISSG top oxide layer (step 306) by reacting hydrogen and oxygen on the wafer surface. Referring to FIG. 4D, an example of a portion of an integrated circuit following step 306 is set forth. A substrate 400 now includes a tunnel oxide 404, a nitride layer 406, and an ISSG top oxide layer 408.

An ISSG top oxide layer 408 may be formed by reacting hydrogen ($H_2$) and oxygen ($O_2$) on a wafer at a temperature in the range of 900° C. to 1100° C. Such a reaction may occur for about 1 minute in order to form an ISSG top oxide layer 408 of about 30–40 Å. A resulting thermally grown oxide according to the present invention may therefore be created with a very small thermal budget relative to conventional oxidation approaches. In one very particular approach, an ISSG top oxide layer 408 may be formed by transferring a wafer from an LPCVD chamber used to form a silicon nitride layer, into an RTO chamber used to form a tunnel dielectric layer. The wafer may then be heated to 900° C. to 1100° C. with $H_2$ and oxygen $O_2$ in the chamber, or introduced into the chamber.

In this way, a high-quality thermal oxide may be achieved without unacceptable diffusion of channel and/or well implant dopants.

An ISSG oxide layer 408 can be denser and of higher quality than a deposited oxide and/or more uniform. In addition, since an ISSG oxide layer 408 can be grown from a charge storing dielectric layer 406, an interface is not necessarily at the original charge storing dielectric surface, but rather within the charge storing dielectric layer 406. Consequently, a resulting interface can be smoother than an interface created with conventional deposition techniques. In addition, such an interface may have less interface traps than conventional approaches, which may result in a higher performance SONOS device that may be scaled to lower programming voltages and yet maintain compatibility with a conventional CMOS process.

Of course, as noted above, unlike conventional approaches for forming a top dielectric layer, an ISSG oxide layer may have a smaller thermal budget than conventional deposition techniques.

Figure 4E:
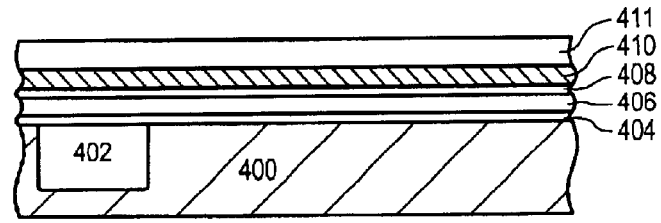
Figure 4F:
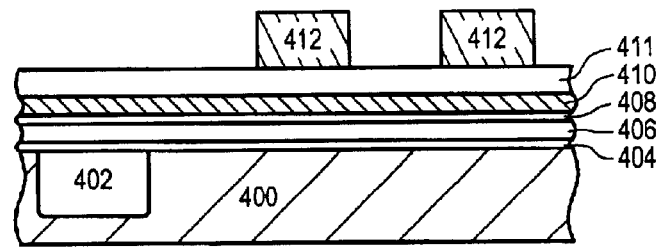

A method according to a second embodiment 300 can continue by depositing a polysilicon gate layer (step 308). An example of a portion of an integrated circuit following step 308 is set forth in FIG. 4E. Referring to FIG. 4E, a polysilicon gate layer 410 has been deposited on an ISSG top oxide layer 408. As also shown in FIG. 4E, a gate protection insulator 411 may be formed over a polysilicon gate layer 410. A gate protection insulator 411 may include silicon nitride, preferably silicon oxynitride, even more preferably silicon oxide.

The second embodiment 300 may continue with lithography and etch steps to isolate and form SONOS devices. A gate mask may first be formed (step 310). An example of a portion of an integrated circuit following step 310 is set forth in FIG. 4F. A gate mask material 412 may be deposited and patterned using any of various lithographic techniques. A gate mask material 412 may generally consist of a photoresist material.

Figure 4G:
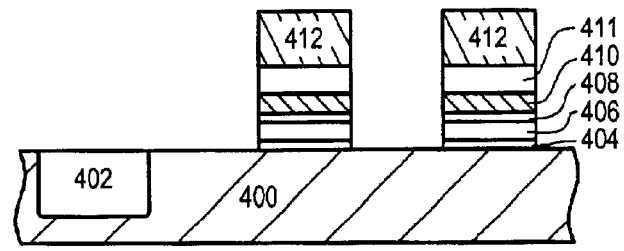

Following the formation of a gate mask (step 310), gates can be etched (step 312). Referring to FIG. 4G, a portion of an integrated circuit following step 312 is set forth. A suitable etch process has been applied to remove portions of the tunnel oxide 404, nitride layer 406, ISSG top oxide layer 408, and polysilicon gate layer 410 that are not covered by gate mask material 412. In one particular approach, gates may be formed by reactive ion etching.

In this manner, SONOS devices can be formed and isolated on a semiconductor substrate 400.

Figure 4H:
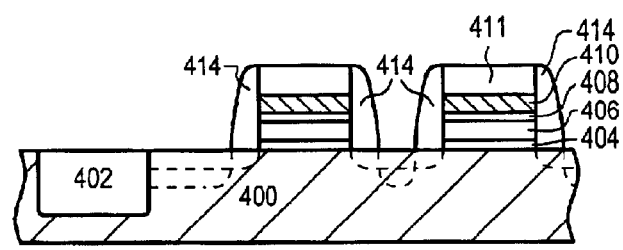

A second embodiment 300 can continue by depositing and etching a spacer layer (step 314). An example of a portion of a semiconductor device following step 314 is set forth in FIG. 4H. Prior to a step 314, a gate mask material 412 may be stripped using a solvent, or etching (ashing), as but two example. Referring to FIG. 4H, a spacer layer 414 has been formed that isolates sides of SONOS gates. A step 314 may include depositing a layer of silicon nitride, silicon oxynitride and/or silicon oxide. Preferably, a spacer layer 414 may include silicon oxide formed by chemical vapor deposition means. The layer may then be anisotropically etched to form sidewall spacers.

A second embodiment 300 may therefore result in an integrated circuit containing SONOS devices with a high-quality top oxide layer 408 that may be created with a very small thermal budget than conventional approaches that deposit a top dielectric layer.

In this way, SONOS devices may be created that offer higher performance, and/or the ability to be scaled to lower programming voltages while maintaining compatibility with conventional CMOS processes.

Figure 5:
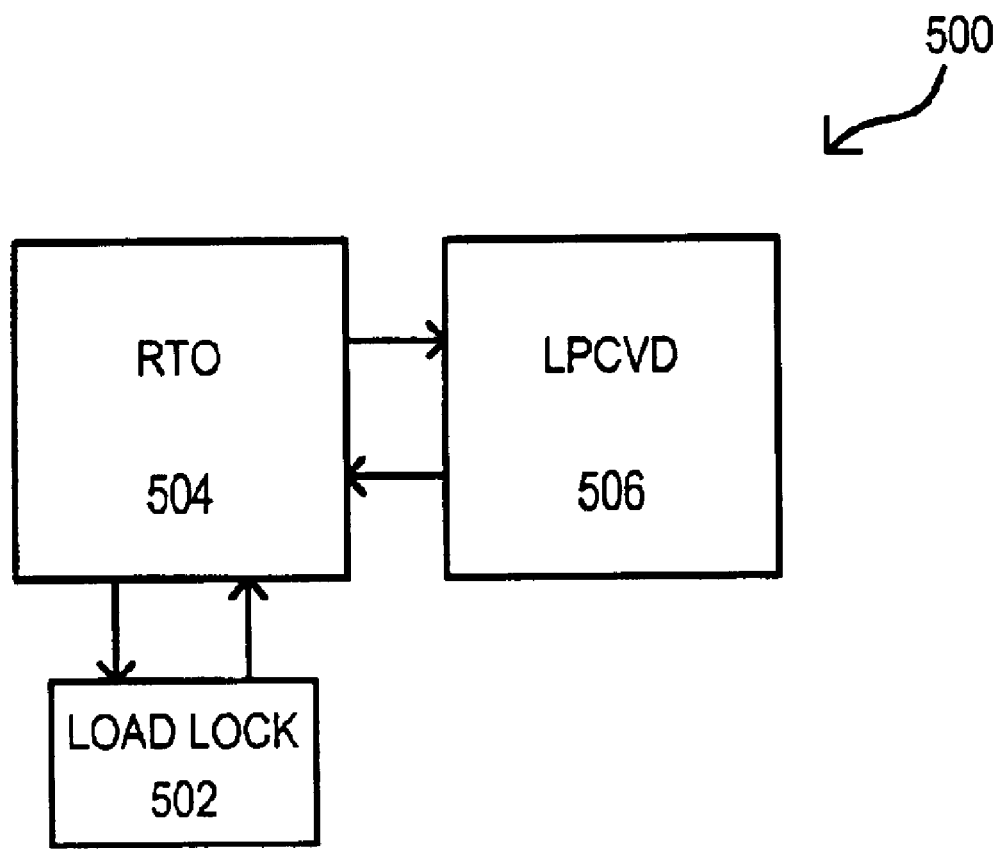
FIG. 5 is a diagram of a wafer processing tool that may be used in the present invention.
Figure 6:
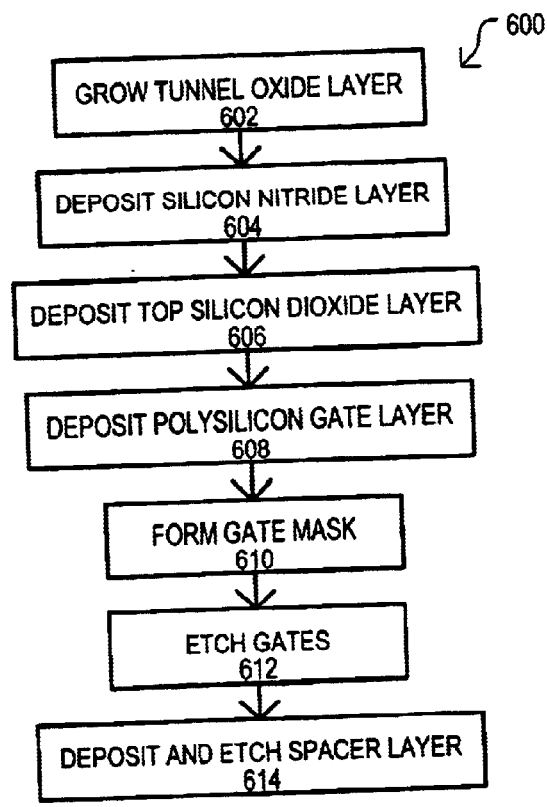
FIG. 6 is a block diagram showing a conventional method of manufacturing a nonvolatile semiconductor device.
Figure 7A:
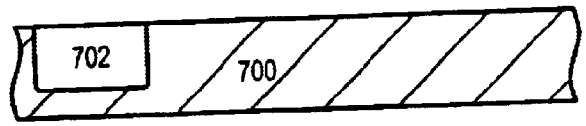
FIGS. 7A to 7G are side cross-sectional views showing the conventional method of FIG. 6.
Figure 7B:
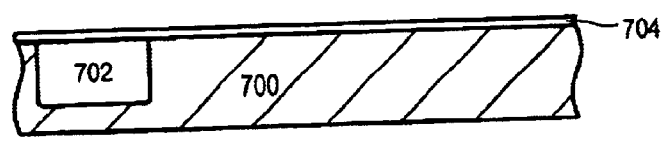
Figure 7C:
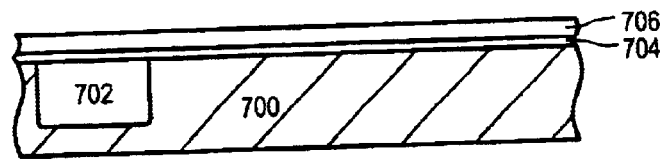
Figure 7D:
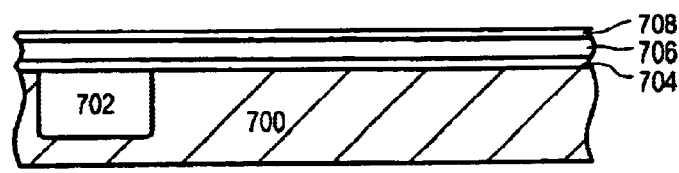
Figure 7E:
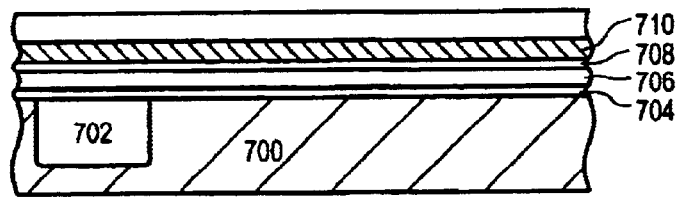
Figure 7F:
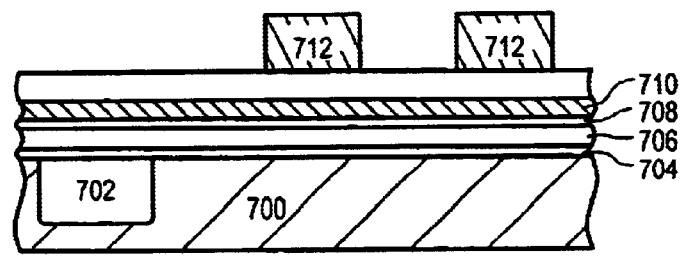
Figure 7G:
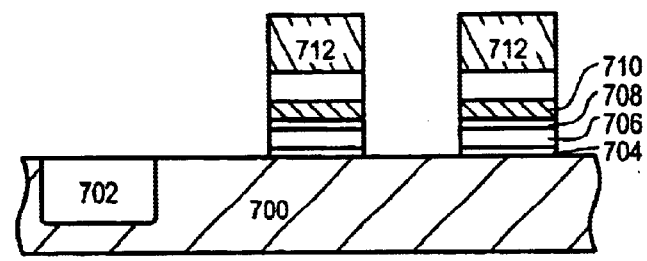
Figure 7H:
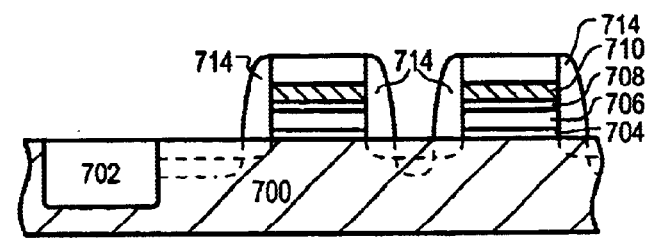
FIG. 7H is a side cross sectional view of a conventional nonvolatile semiconductor device.

Referring now to FIG. 5, a wafer processing tool that may be used in the present invention is shown in a block diagram. A wafer processing tool is designated by the general reference character 500 and may include a load lock 502, an RTO chamber 504, and an LPCVD chamber 506. An RTO chamber 504 may be capable of conventional dry oxidation as well as ISSG oxidation, and an LPCVD chamber 506 that may be capable of nitride deposition.

Using a tool, such as that shown in FIG. 5, a wafer may be loaded via a load lock 502. A tunneling oxide may then be grown (step 302) in an RTO chamber 504 using conventional dry oxidation. A wafer may then be moved to an LPCVD chamber 506 where a nitride may be deposited (step 304). Finally, a wafer may be moved back to an RTO chamber 504 and a top oxide layer may be grown using ISSG oxidation (step 306). In this way, the SONOS dielectric layers may be formed with minimal movement of wafers between processing machines.

The use of single tool, as described above, may reduce defects by minimizing a wafer's exposure to external environments. Further, such an approach may simplify a manufacturing process by localizing the formation of a SONOS-type device dielectric.

It is understood that while various embodiments have been described in detail, the present invention could be subject to various changes, substitutions, and alterations without departing from the spirit and scope of the invention. Accordingly, the present invention is intended to be limited only as defined by the appended claims.

What is claimed is:

1. A method of forming a plurality of semiconductor device layers, comprising the steps of:

forming an oxide layer on an exposed surface of an insulating layer comprising silicon and nitrogen by reacting hydrogen with oxygen on the exposed surface of the insulating layer deposited over a wafer; and forming a conductive gate layer over the oxide layer.

2. The method of claim 1, wherein:

the reacting of hydrogen with oxygen is performed at a wafer temperature in the range of about 800° C. to 1300° C.

3. The method of claim 1, wherein:

the oxide layer has a thickness in the range of 20–60 angstroms.

4. The method of claim 1, wherein:

the reacting of hydrogen with oxygen on the wafer surface has a duration in the range of 30 seconds to 2 minutes.

5. The method of claim 4, wherein:

the reacting of hydrogen with oxygen on the wafer surface has a duration in the range of approximately 1 minute.

6. The method of claim 1, wherein:

the conductive gate material includes polysilicon.

7. The method of claim 1, wherein:

the oxide layer and conductive gate layer form a SONOS-type device.

8. The method of claim 1 wherein steps prior to forming the oxide layer comprise:

forming a tunnel dielectric; and depositing the insulating layer, the insulating layer being a charge storing dielectric layer.

9. The method of claim 8, wherein:

the charge storing dielectric layer includes silicon nitride.

10. The method of claim 1, further including:

forming a gate etch mask; and etching to form gate stacks; and forming insulating sidewalls on the gate stacks.

11. The method of claim 8, wherein:

forming the tunnel dielectric, forming the charge storing dielectric layer, and forming the oxide layer occur in a single wafer processing tool.

12. A method, comprising the steps of:

forming a bottom dielectric on a substrate surface;

forming a middle dielectric over the bottom dielectric; and forming a top dielectric over the middle dielectric by heating the substrate to less than about 1200° C. for less than two minutes and reacting a hydrogen containing source gas with an oxygen containing source gas on the surface of the middle dielectric.

13. The method of claim 12, wherein:

the middle dielectric comprises at least one layer selected from the group consisting of silicon nitride, silicon oxynitride, and silicon rich silicon nitride.

14. The method of claim 12, wherein:

the bottom dielectric has a thickness of less than 15 angstroms; and the top dielectric has a thickness of less than 50 angstroms.

15. A method of manufacturing a SONOS-type device, comprising the steps of:

oxidizing a charge storing dielectric comprising at least one layer that includes silicon and nitrogen by reacting hydrogen with oxygen to form a top oxide layer over the charge storing dielectric.

16. The method of claim 15, wherein:

the oxidizing lasts for less than two minutes.

17. The method of claim 15, wherein:

the oxidizing occurs at a temperature of less than 1200° C.

18. The method of claim 15, further including:

a tunnel dielectric formed below the charge storing dielectric;

forming a conductive gate layer over the top oxide layer; and patterning at least the top oxide and charge storing dielectric to form a gate stack.

19. The method of claim 18, further including:

forming the tunnel dielectric, forming the top oxide layer, and forming the top dielectric in the same wafer processing tool.

20. The method of claim 8, further including:

forming the bottom dielectric, the middle dielectric and the top dielectric in the same wafer processing tool.

* * * * *